US010199233B2

(12) United States Patent
Miyamoto et al.

(10) Patent No.: US 10,199,233 B2
(45) Date of Patent: Feb. 5, 2019

(54) ACTIVE MATRIX SUBSTRATE

(71) Applicant: SHARP KABUSHIKI KAISHA, Sakai, Osaka (JP)

(72) Inventors: Tadayoshi Miyamoto, Sakai (JP); Fumiki Nakano, Sakai (JP)

(73) Assignee: SHARP KABUSHIKI KAISHA, Sakai, Osaka (JP)

(*) Notice: Subject to any disclaimer, the term of this patent is extended or adjusted under 35 U.S.C. 154(b) by 0 days.

(21) Appl. No.: 15/579,177

(22) PCT Filed: Jun. 2, 2016

(86) PCT No.: PCT/JP2016/066368
§ 371 (c)(1),
(2) Date: Dec. 1, 2017

(87) PCT Pub. No.: WO2016/195005
PCT Pub. Date: Dec. 8, 2016

(65) Prior Publication Data
US 2018/0226266 A1 Aug. 9, 2018

(30) Foreign Application Priority Data
Jun. 4, 2015 (JP) ................ 2015-114074

(51) Int. Cl.
*H01L 21/3205* (2006.01)
*H01L 23/522* (2006.01)
(Continued)

(52) U.S. Cl.
CPC ........ *H01L 21/3205* (2013.01); *H01L 21/768* (2013.01); *H01L 23/522* (2013.01);
(Continued)

(58) Field of Classification Search
CPC . H01L 21/3205; H01L 21/768; H01L 23/522; H01L 27/146; H01L 27/14663;
(Continued)

(56) References Cited

U.S. PATENT DOCUMENTS 6,480,577 B1* 11/2002 Izumi ................ G02F 1/136213
257/546
2001/0030860 A1* 10/2001 Kimura ................ G02B 6/0028
362/620
(Continued)

FOREIGN PATENT DOCUMENTS

JP 2000-353808 A 12/2000
JP 3814568 B2 8/2006
(Continued)

*Primary Examiner* — Walter H Swanson
(74) *Attorney, Agent, or Firm* — ScienBiziP, P.C.

(57) ABSTRACT

An active matrix substrate includes a substrate 31; gate lines arranged on the substrate 31 and extend in a first direction; source lines Si arranged on the substrate 31 and extend in a second direction that is different from the first direction; transistors 2 arranged in correspondence to points of intersection between the gate lines and the source lines, respectively, and are connected with the gate lines and the source lines; and an insulating layer. At least either the gate lines and the source lines are connected with electrodes of the transistors via contact holes in the insulating layer, and are formed to satisfy at least either i) having a greater film thickness or ii) being formed with a material having a smaller specific resistance, as compared with the electrodes of the transistors to which the lines are connected via the contact holes in the insulating layer.

5 Claims, 12 Drawing Sheets

(51) Int. Cl.

| | |
|---|---|
| *H01L 21/768* | (2006.01) |
| *H01L 29/786* | (2006.01) |
| *H01L 27/146* | (2006.01) |
| *H04N 21/435* | (2011.01) |
| *H04N 21/439* | (2011.01) |
| *H04N 21/44* | (2011.01) |
| *H04N 21/462* | (2011.01) |
| *H04N 21/845* | (2011.01) |
| *H01L 23/532* | (2006.01) |
| *H04N 21/488* | (2011.01) |

(52) U.S. Cl.
CPC .... *H01L 23/5329* (2013.01); *H01L 23/53204* (2013.01); *H01L 27/146* (2013.01); *H01L 29/786* (2013.01); *H04N 21/435* (2013.01); *H04N 21/439* (2013.01); *H04N 21/44* (2013.01); *H04N 21/462* (2013.01); *H04N 21/8456* (2013.01); *H04N 21/4884* (2013.01)

(58) Field of Classification Search
CPC ......... H01L 27/14659; H01L 27/14689; H01L 27/14692; H01L 29/786
See application file for complete search history.

(56) References Cited

U.S. PATENT DOCUMENTS

| | | |
|---|---|---|
| 2003/0038306 A1 | 2/2003 | Izumi et al. |
| 2009/0026509 A1 | 1/2009 | Hayashi et al. |
| 2014/0103347 A1 | 4/2014 | Ishino |
| 2014/0367690 A1* | 12/2014 | Kimura ............... G02B 6/0028 257/66 |

FOREIGN PATENT DOCUMENTS

| | | |
|---|---|---|
| JP | 2009-295908 A | 12/2009 |
| JP | 2011-017755 A | 1/2011 |
| JP | 5286691 B2 | 9/2013 |
| JP | 2014-078651 A | 5/2014 |
| WO | 2016/163347 A1 | 10/2016 |

* cited by examiner ated in FIG. 5A.
ACTIVE MATRIX SUBSTRATE

TECHNICAL FIELD

The present invention relates to an active matrix substrate.

BACKGROUND ART

An active matrix substrate is known that has the following configuration: a plurality of scanning lines (gate lines) extending in a first direction, and a plurality of data lines (source lines) extending in a second direction that is different from the first direction, are arranged on a substrate, and at the same time, transistors are arranged in correspondence to points of intersection between the scanning lines and the data lines (see Patent Document 1).

PRIOR ART DOCUMENT

Patent Document

Patent Document 1: JP-A-2011-017755

SUMMARY OF THE INVENTION

Problem to be Solved by the Invention

If lines such as the scanning lines and the data lines have great resistances, delays occur to the signal transmission to the ends of the lines. The resistances of the lines are therefore preferably smaller.

It is an object of the present invention to provide a technique for reducing the resistances of the lines on the active matrix substrate.

Means to Solve the Problem

An active matrix substrate in one embodiment of the present invention includes: a substrate; a plurality of first lines that are arranged on the substrate and extend in a first direction; a plurality of second lines that are arranged on the substrate and extend in a second direction that is different from the first direction; transistors that are arranged in correspondence to points of intersection between the first lines and the second lines, respectively, and are connected with the first lines and the second lines; and an insulating layer, wherein at least either the first lines or the second lines are connected with electrodes of the transistors via contact holes in the insulating layer, and are formed so as to satisfy at least either a condition of having a greater film thickness or a condition of being formed with a material having a smaller specific resistance, as compared with the electrodes of the transistors to which the lines are connected via the contact holes in the insulating layer.

Effect of the Invention

According to the disclosure of the Invention, at least either the first lines or the second lines are arranged in a layer different from a layer where the electrodes of the transistors to which the lines are connected, with an insulating layer being interposed between the lines and the electrodes, and are formed so as to satisfy at least either a condition of having a greater film thickness or a condition of being formed with a material having a smaller specific resistance, as compared with the electrodes of the transistors arranged in the layer different from the layer of the lines. This allows at least either the first lines or the second lines to be formed so as to satisfy at least either a condition of having a greater film thickness or a condition of being formed with a material having a smaller specific resistance, without being restricted by the configuration of the electrodes of the transistors. This makes it possible to reduce the resistance of at least either the first lines or the second lines.

MODE FOR CARRYING OUT THE INVENTION

Figure 1:
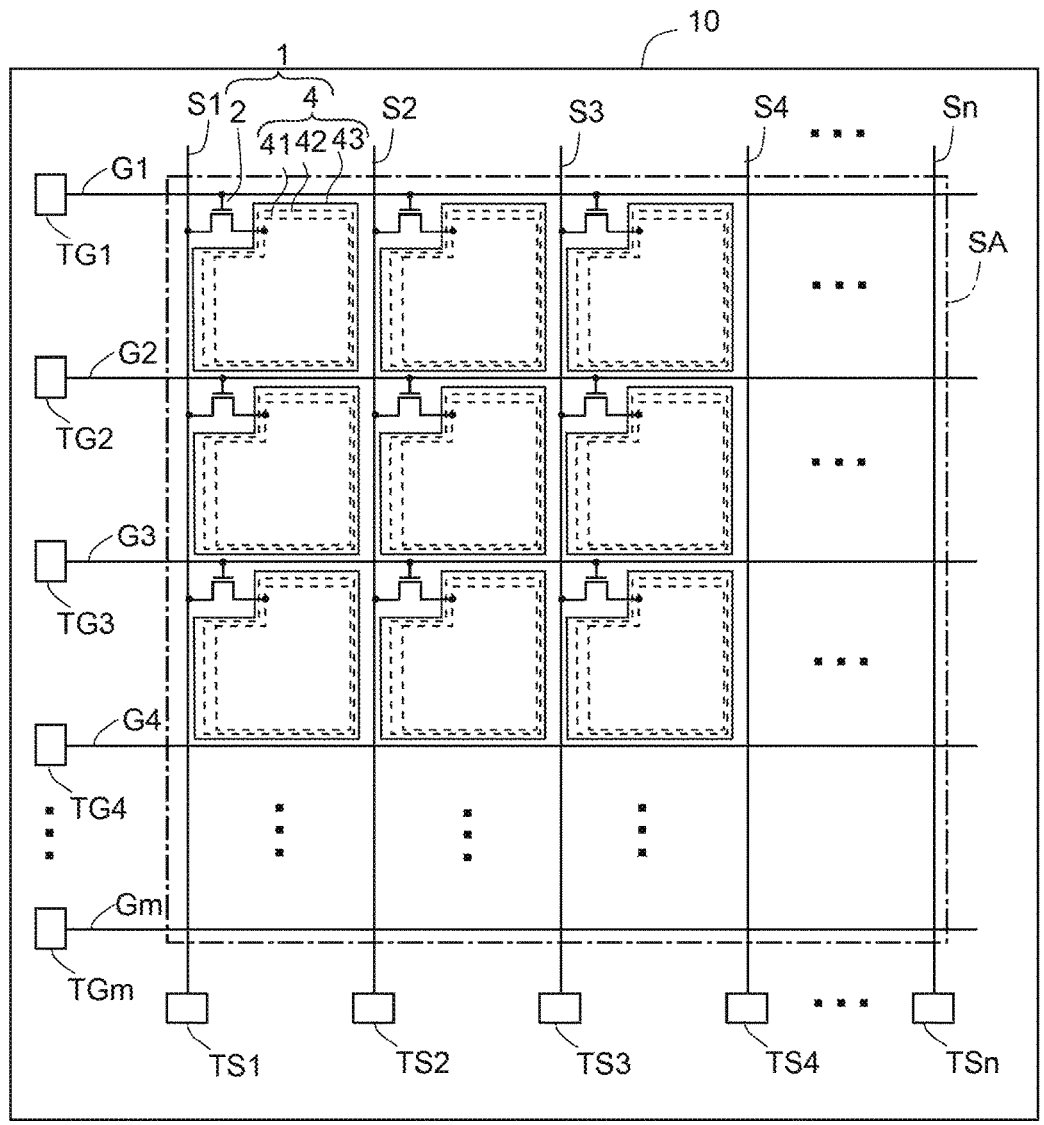
FIG. 1 is a plan view illustrating an exemplary configuration of a photosensor substrate in Embodiment 1.

An active matrix substrate in one embodiment of the present invention includes: a substrate; a plurality of first lines that are arranged on the substrate and extend in a first direction; a plurality of second lines that are arranged on the substrate and extend in a second direction that is different from the first direction; transistors that are arranged in correspondence to points of intersection between the first lines and the second lines, respectively, and are connected with the first lines and the second lines; and an insulating layer, wherein at least either the first lines or the second lines are connected with electrodes of the transistors via contact holes in the insulating layer, and are formed so as to satisfy at least either a condition of having a greater film thickness or a condition of being formed with a material having a smaller specific resistance, as compared with the electrodes of the transistors to which the lines are connected via the contact holes in the insulating layer (the first configuration).

According to first configuration, at least either the first lines or the second lines are arranged in a layer different from a layer where the electrodes of the transistors to which the lines are connected, with an insulating layer being interposed between the lines and the electrodes, and are formed so as to satisfy at least either a condition of having a greater film thickness or a condition of being formed with a material having a smaller specific resistance, as compared with the electrodes of the transistors arranged in the layer different from the layer of the lines. This allows at least either the first lines or the second lines to be formed so as to satisfy at least either a condition of having a greater film thickness or a condition of being formed with a material having a smaller specific resistance, without being restricted by the configuration of the electrodes of the transistors. This makes it possible to reduce the resistance of at least either the first lines or the second lines.

The first configuration can be such that each transistor includes a gate electrode, a gate insulating film, a semiconductor layer provided at a position opposed to the gate electrode with the gate insulating film being interposed therebetween, and a drain electrode and a source electrode that are connected with the semiconductor layer and that are provided so as to be opposed to each other in a direction parallel with the substrate; and the first lines are formed in the same layer as that of the drain electrode and the source electrode, and are connected with the gate electrodes via contact holes in the gate insulating film, wherein the second lines are connected to the drain electrodes or the source electrodes of the transistors via the contact holes in the insulating layer arranged so as to overlap with the gate insulating film (the second configuration).

According to the second configuration, both of the first lines and the second lines can be arranged in a layer different from the layer where the electrodes of the transistors to which the lines are connected are provided. Besides, the layers where conductors are arranged are following three: a layer where the gate electrodes are arranged; a layer where the drain electrodes, the source electrodes, and the first lines are arranged; and a layer where the second lines are arranged. This therefore makes it possible to reduce the resistances of the first lines and the second lines, while preventing a substantial increase in the steps of forming films of the conductors.

The first or second configuration can be such that the insulating layer includes a passivation film that covers the transistors, and the active matrix substrate further includes photoelectric conversion elements arranged in correspondence to points of intersection between the first lines and the second lines, respectively, the photoelectric conversion elements being connected with the transistors via contact holes in the passivation film (the third configuration).

The third configuration allows, in the photosensor substrate including the photoelectric conversion elements, too, at least either the first lines or the second lines to be formed so as to satisfy at least either a condition of having a greater film thickness or a condition of being formed with a material having a smaller specific resistance, without being restricted by the configuration of the electrodes of the transistors. This makes it possible to reduce the resistance of at least either the first lines or the second lines.

The second configuration can be also such that the insulating layer includes a passivation film that covers the transistors, and the active matrix substrate further includes photoelectric conversion elements arranged in correspondence to points of intersection between the first lines and the second lines, respectively, the photoelectric conversion elements being connected with the transistors via the contact holes in the gate insulating film (the fourth configuration).

The fourth configuration allows, in the photosensor substrate including the photoelectric conversion elements, too, at least either the first lines or the second lines to be formed so as to satisfy at least either a condition of having a greater film thickness or a condition of being formed with a material having a smaller specific resistance, without being restricted by the configuration of the electrodes of the transistors. This makes it possible to reduce the resistance of at least either the first lines or the second lines.

The third or fourth configuration may be such that the insulating layer further includes a flattening film provided on portions of the passivation film where the photoelectric conversion elements are not provided, and at portions where the first lines and the second lines intersect, the passivation film and the flattening film are arranged between the first lines and the second lines, when viewed in a direction vertical to the substrate (the fifth configuration).

With the fifth configuration, in each of the portions where the first lines and the second lines intersect with each other, the distance between the first line and the second line can be ensured with the passivation film and the flattening film. This makes it possible to reduce the capacitance between the first line and the second line.

The second configuration can be such that the gate electrode of the transistor is provided between the gate insulating film and the substrate (the sixth configuration).

In the case of the bottom gate type transistor, the gate electrodes are arranged in a layer below the semiconductor layer. The material and film thickness of the gate electrodes are restricted by the process of producing the semiconductor layer of the transistor. In a case where the gate electrode and the line connected with the gate electrode are integrally formed in the same layer, therefore, the configurations of the line connected with the gate electrode, such as the material and film thickness thereof, are restricted by the process of producing the semiconductor film of the transistor. According to the sixth configuration, however, the first lines and the second lines can be formed after the semiconductor layer of the transistor is formed, which allows the configurations of the first lines and the second lines, such as the materials and film thicknesses thereof to be less restricted by the process of producing the semiconductor layer of the transistor. This allows the freedom of design of the line arrangement of the first lines and the second lines to improve further.

EMBODIMENT

The following description describes embodiments of the present invention in detail, while referring to the drawings. Identical or equivalent parts in the drawings are denoted by the same reference numerals, and the descriptions of the same are not repeated. To make the description easy to understand, in the drawings referred to hereinafter, the configurations are simply illustrated or schematically illustrated, or the illustration of a part of constituent members is omitted. Further, the dimension ratios of the constituent members illustrated in the drawings do not necessarily indicate the real dimension ratios.

[Embodiment 1]

The following description refers to, as an example, a photosensor substrate in which photoelectric conversion elements are arranged on an active matrix substrate.

The photosensor substrate can be used in a photosensor, an X-ray image detection device, or the like.

FIG. 1 is a plan view illustrating an exemplary configuration of a photosensor substrate in the present embodiment. On the photosensor substrate 10 illustrated in FIG. 1, there are provided a plurality of gate lines G1, G2, . . . Gm (hereinafter, these are collectively referred to as "gate lines G" when they are not distinguished particularly) extending in a first direction (horizontal direction), and a plurality of source lines S1, S2, . . . Sn (hereinafter, these are collectively referred to as "source lines S" when they are not distinguished particularly) extending in a second direction (vertical direction) that intersects with the gate lines G.

A thin film transistor (TFT) 2, which is an exemplary transistor, is provided at a position corresponding to every point of intersection between the gate lines G and the source lines S. Each TFT 2 is connected to the gate line G, the source line S, and a lower electrode 41. The lower electrode 41 is a lower electrode 41 of a photodiode 4, which is an exemplary photoelectric conversion element.

The lower electrode 41 is arranged in an area surrounded by two adjacent ones of the gate lines G and two adjacent ones of the source lines S. At a position that overlaps the lower electrode 41, a semiconductor film 42 and an upper electrode 43 are provided. The photodiode 4 is formed with these which are stacked, i.e., the lower electrode 41, the semiconductor film 42, and the upper electrode 43. The lower electrode 41, the semiconductor film 42, and the upper electrode 43 are arranged in a state of being stacked in a direction vertical to a surface of the photosensor substrate 10.

One sensor part 1 is formed with a pair of one TFT 2 and one photodiode 4. The sensor parts 1 are arranged in matrix on the surface of the photosensor substrate 10. The sensor parts 1 are respectively provided in areas each of which is surrounded by two adjacent ones of the gate lines G and two adjacent ones of the source lines S. One sensor part 1 corresponds to one pixel.

The photodiode 4 in each sensor part 1 converts light projected to the semiconductor film 42 into charges (electrons or holes). More specifically, when a voltage is applied to the semiconductor film 42 and the semiconductor film 42 is in a reverse bias state, light projected to the semiconductor film 42 is converted to charges excited in a depletion layer. The charges thus obtained by conversion are taken out via the source line S to the outside when the TFT 2 is turned ON in response to a signal supplied from the gate line G. Thus, an electric signal according to the amount of received light is output. In this way, the photosensor substrate 10 converts the amount of light projected to each sensor part 1 into the amount of electric current, and outputs the same in the form of an electric signal. As a result, an image corresponding to the state of each sensor part 1 is obtained.

The gate lines G and the source lines S are led to the outside of the sensor area SA. The sensor area SA is an area on the photosensor substrate 10 where the sensor part 1 is arranged, when viewed in a direction vertical to the substrate (the normal direction of the substrate), that is, an area where light is detected. In the outside of the sensor area SA, the gate lines G1 to Gm are connected to the terminal parts TG1 to TGm (hereinafter, these terminal parts are collectively referred to as "terminal parts TG" when they are not distinguished particularly), respectively, and the source lines S1 to Sn are connected to the terminal parts TS1 to TSn (hereinafter, these terminal parts are collectively referred to as "terminal parts TS" when they are not distinguished particularly), respectively.

To the terminal parts TG of the gate lines G, for example, a circuit that outputs driving signals to be supplied to the gate lines G can be connected. To the terminal parts TS of the source lines S, for example, a circuit that processes signals output from the source lines S (an amplifier that amplifies signals, an A/D converter for A/D (analog/digital) conversion of signals, etc., as examples), or the like can be connected.

Figure 2:
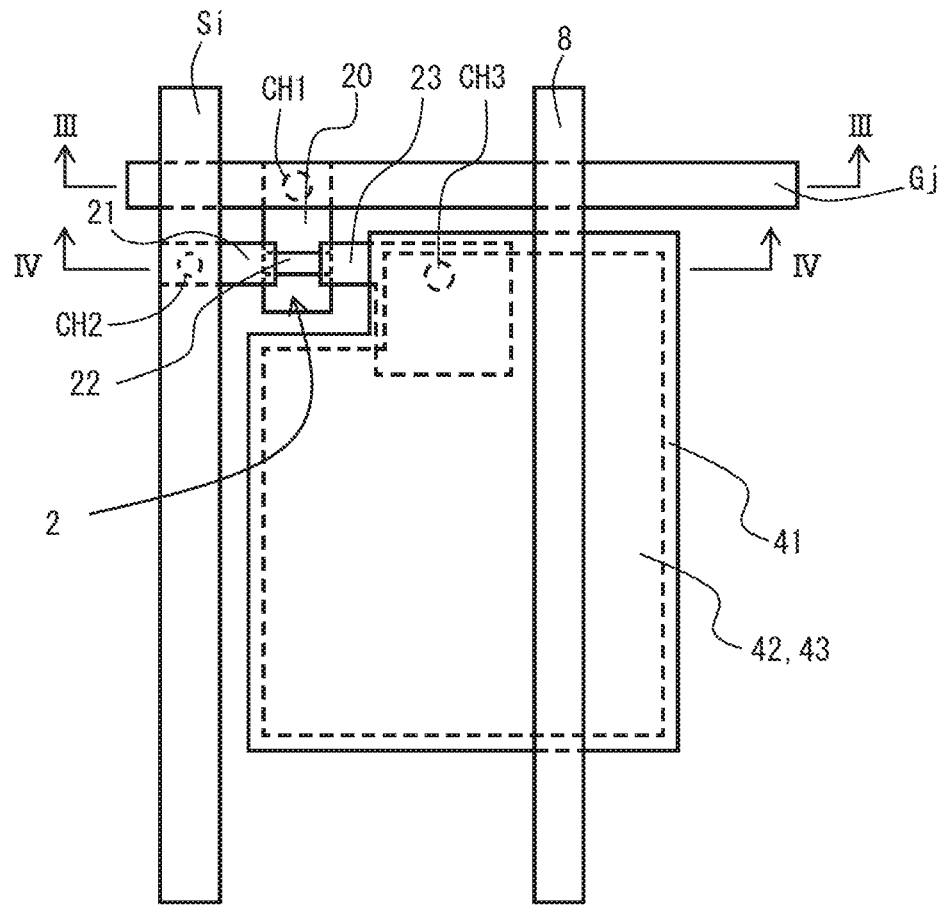
FIG. 2 illustrates an exemplary configuration of a sensor part when viewed in a direction vertical to the photosensor substrate.
Figure 3:
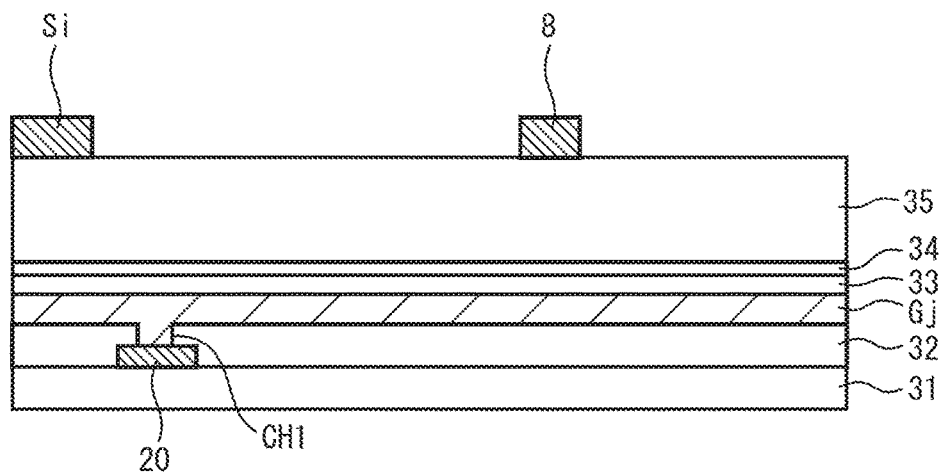
FIG. 3 is a cross-sectional view taken along line III-III in FIG. 2.
Figure 4:
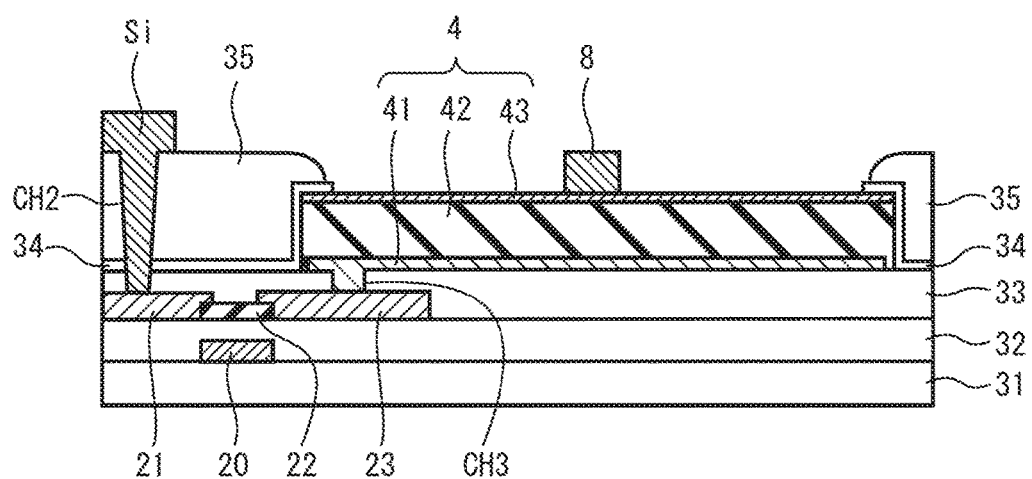
FIG. 4 is a cross-sectional view taken along line IV-IV in FIG. 2.

FIG. 2 illustrates an exemplary configuration of the sensor part 1 when viewed in the direction vertical to the photosensor substrate 10. FIG. 2 illustrates the configuration of the sensor part 1 corresponding to a point of intersection between the i-th source line Si and the j-th gate line Gj. FIG. 3 is a cross-sectional view taken along line III-III in FIG. 2. FIG. 4 is a cross-sectional view taken along line IV-IV in FIG. 2.

The TFT 2 is provided at a position corresponding to the point of intersection between the source line Si and the gate line Gj. The TFT 2 includes a gate electrode 20, a source electrode 21, a semiconductor layer 22, and a drain electrode 23. The drain electrode 23 is connected to the lower electrode 41 of the photodiode 4.

The source electrode 21, the semiconductor layer 22, and the drain electrode 23 are provided in the same layer, and the source electrode 21 and the drain electrode 23 are opposed to each other in a direction parallel to the substrate. The semiconductor layer 22 includes an area arranged between the source electrode 21 and the drain electrode 23. The gate electrode 20 is provided at a position that at least partially overlaps the semiconductor layer 22 when viewed in the normal direction of the substrate.

The lower electrode 41 of the photodiode 4 is formed in an area surrounded by the source line Si and the source line Si+1 (not shown) adjacent thereto, as well as the gate line Gj and the gate line Gj+1 (not shown) adjacent thereto. In this area, the semiconductor film 42 and the upper electrode 43 of the photodiode 4 are provided so as to overlap the lower electrode 41.

A bias line 8 is provided at a position that overlaps the upper electrode 43 of the photodiode 4. The bias line 8 is electrically connected with the upper electrode 43. The bias line 8 extends to outside of the sensor area SA, in the same direction as the direction in which the source line Si extends, and are also electrically connected to other upper electrodes 43 of the sensor parts 1 arrayed in this direction. The bias line 8 is a line for applying a reverse bias voltage to the semiconductor films 42.

As illustrated in FIG. 4, the gate electrodes 20 are arranged on the substrate 31, and a gate insulating film 32, which is an insulating layer, is formed so as to cover the substrate 31 and the gate electrodes 20.

In the present embodiment, as illustrated in FIG. 3, the gate line Gj is provided in a layer different from the layer where the gate electrode 20 is provided. More specifically, the gate insulating film 32 is formed so as to cover the gate electrode 20, and the gate line Gj is formed on the gate insulating film 32. A contact hole CH1 is formed in the gate insulating film 32. The gate electrode 20 is connected with the gate line Gj via the contact hole CH1.

The area of the contact hole CH1 when viewed in the normal direction of the substrate 31 is smaller than the area of the gate electrode 20. In contrast, the area of the contact hole CH1 when viewed in the normal direction of the substrate 31 may be approximately equal to or greater than the area of the gate electrode 20.

As illustrated in FIG. 4, the source electrode 21 and the drain electrode 23 of the TFT 2 are arranged on the gate insulating film 32 so as to be opposed to each other. The semiconductor layer 22 is formed on the gate insulating film 32, extending at least from an end of the source electrode 21 to an end of the drain electrode 23 opposed to the foregoing source electrode 21. In the example illustrated in FIG. 4, the end of the source electrode 21 gets on one of ends of the semiconductor layer 22, and the end of the drain electrode 23 gets on the other end of the semiconductor layer 22. The semiconductor layer 22 is provided at a position that overlaps the gate electrode 20 when viewed in the normal direction of the substrate 31. The gate line Gj is provided in the same layer as that of the source electrode 21, the semiconductor layer 22, and the drain electrode 23.

The semiconductor layer 22 can be formed with an oxide semiconductor or a silicon-based semiconductor. The oxide semiconductor may include, for example, an In—Ga—Zn—O-based semiconductor that contains, as principal components, indium, gallium, zinc, and oxygen. The In—Ga—Zn—O-based semiconductor may contain a crystalline part. Specific examples of the oxide semiconductor are described below.

A first passivation film 33, which is an insulating layer, is formed so as to cover the source electrode 21, the semiconductor layer 22, and the drain electrode 23.

On the first passivation film 33, the lower electrode 41, the semiconductor film 42, and the upper electrode 43 of the photodiode 4 are laminated in the stated order.

The lower electrode 41 is formed in a layer different from the layer where the source electrode 21, the semiconductor layer 22, and the drain electrode 23 are formed, with the first passivation film 33 being interposed therebetween. A part of the lower electrode 41 is opposed to the drain electrode 23, with the first passivation film 33 being interposed therebetween.

In the first passivation film 33, a contact hole CH3 for electrically connecting the lower electrode 41 and the drain electrode 23 is formed. In other words, the lower electrode 41 is electrically connected with the drain electrode 23 via the contact hole CH3.

The area of the contact hole CH3 when viewed in the normal direction of the substrate 31 is smaller than the area of the lower electrode 41. In contrast, the area of the contact hole CH3 when viewed in the normal direction of the substrate 31 may be approximately equal to or greater than the area of the lower electrode 41. in this case, the lower electrode 41 can be formed in the same layer as that of the source electrode 21, semiconductor layer 22, and the drain electrode 23. In this case, the lower electrode 41 can be formed as a conductor formed integrally with the drain electrode 23.

On the lower electrode 41, the semiconductor film 42 is formed, so as to be in contact with the lower electrode 41. On the semiconductor film 42, the upper electrode 43 is formed. More specifically, the upper electrode 43 is opposed to the lower electrode 41, with the semiconductor film 42 being interposed therebetween.

On the upper electrode 43, the bias line 8 is formed.

The semiconductor film 42 may have a configuration in which an n-type (n+) semiconductor layer, an i-type semiconductor layer, and a p-type (p+) semiconductor layer are laminated in the stated order. For these semiconductor layers, for example, amorphous silicon can be used. The upper electrode 43 can be a transparent electrode made of, for example, ITO, IZO, ZnO, SnO, or the like.

The second passivation film 34, which is an insulating layer, is formed so as to cover a part of the first passivation film 33 and the photodiode 4. On the second passivation film 34, the flattening film 35, which is an insulating layer, is formed.

In the present embodiment, as illustrated in FIG. 4, the source line Si is provided in a layer different from that of the source electrode 21. More specifically, the first passivation film 33, the second passivation film 34, and the flattening film 35 are formed in the stated order on the source electrode 21, and the source line Si is formed on the flattening film 35. A contact hole CH2 is formed in the first passivation film 33, the second passivation film 34, and the flattening film 35, so as to pass therethrough from the source line Si to the source electrode 21. As illustrated in FIG. 4, the source electrode 21 is connected with the source line Si via the contact hole CH2.

The area of the contact hole CH2 when viewed in the normal direction of the substrate 31 is smaller than the area of the source line Si, but it may be approximately equal to or greater than the area of the source line Si.

In a conventional active matrix substrate, the gate lines are provided in the same layer as the layer where the gate electrodes are provided, and the gate lines and the gate electrodes are integrally formed. It is therefore difficult to form the gate lines with a material or a film thickness different from the material or the film thickness of the gate electrodes.

In the present embodiment, however, the gate line Gj is formed in a layer different from the layer of the gate electrode 20. The material or the film thickness of the gate line Gj, therefore, can be different from the material or the film thickness of the gate electrode 20. In other words, since the gate line Gj is not integrally formed with the gate electrode 20, it is easier to form the gate line Gj by using a material different from that of the gate electrode 20 in such a manner that the gate line Gj has a film thickness different from that of the gate electrode 20.

In the present embodiment, a material having a lower specific resistance than that of the gate electrode 20 is used as the material for the gate line Gj. As the material for the gate line Gj, a material having a specific resistance of, for example, ½ or smaller, as compared with the specific resistance of the material for the gate electrode 20, can be selected. Further, the gate line Gj has a film thickness greater than the film thickness of the gate electrode 20. The film thickness of the gate line Gj may be set to be equal to or greater than twice the film thickness of the gate electrode 20, for example. This makes it possible to reduce the resistance of the gate line Gj, as compared with the case where the material and film thickness of the gate line Gj are identical to the material and film thickness of the gate electrode 20.

The gate line Gj is formed with a material having a specific resistance equal to that of the gate electrode 20, but alternatively, the configuration may be such that the film thickness is increased instead. Further alternatively, the configuration may be such that a material having a specific resistance smaller than that of the gate electrode 20 is used for forming the gate line Gj, with a film thickness thereof being equal to that of the gate electrode 20. In any case, the resistance of the gate line Gj can be reduced, as compared with the case where the material and film thickness of the gate line Gj are equal to the material and film thickness of the gate electrode 20.

Further, in the conventional active matrix substrate, the source line is provided in the same layer as the layer where the source electrode is provided, and the source line and the source electrode are integrally formed. Therefore, it is difficult to form the source line with a material different from that of the source electrode, or to form the source line, in such a manner that it has a film thickness different from that of the source electrode.

In the present embodiment, however, the source line Si is provided in a layer different from the layer where the source electrode 21 is provided. This makes it possible to form the source line Si, with a material different from that of the source electrode 21, or in such a manner that the source line Si has a film thickness different from that of the source line Si. More specifically, since the source line Si is not integrally formed with the source electrode 21, it is easy to form the source line Si by using a material different from that of the source electrode 21, in such a manner that the source line Si has a thickness different from that of the source electrode 21.

In the present embodiment, the film thickness of the source line Si is greater than the film thickness of the source electrode 21. The film thickness of the source line Si can be set to be equal to or greater than twice the film thickness of the source electrode 21, for example. It is described, in the description of a producing process below, that as the material for the source line Si, the same material as that for the source electrode 21 is used, but a material having a specific resistance lower than the specific resistance of the material for the source electrode 21, for example, a material whose specific resistance is ½ or less, as compared with the material for the source electrode 21, can be used. This makes it possible to decrease the resistance of the source line Si, as compared with a case where the material and film thickness of the source line Si are the same as those of the source electrode 21.

Incidentally, it is also possible to form the source line Si by using a material having a specific resistance smaller than that of the source electrode 21, while the film thickness of the source line S1 is equal to that of the source electrode 21. In other words, if the source line Si is formed so as to satisfy at least either one of a condition of having a greater film thickness, or a condition of being formed with a material having a smaller specific resistance, as compared with the source electrode 21, the resistance of the source line Si can be reduced, as compared with a case where the material and film thickness of the source line Si are the same as the material and film thickness of the source electrode 21.

(Producing Process)

FIGS. 5A to 5H illustrate exemplary producing steps for producing the photosensor substrate in the present embodiment. FIGS. 5A to 5H illustrate cross sections of a portion where the sensor part 1 is formed.

<Substrate>

The substrate 31 is, for example, a glass substrate, a silicon substrate, a plastic substrate or a resin substrate having heat-resisting properties, or the like. For forming the plastic substrate or the resin substrate, for example, polyethylene terephthalate (PET), polyethylene naphthalate (PEN), polyether sulfone (PES), acryl, polyimide, or the like can be used.

<Forming Gate Electrode>

On the substrate 31, the gate electrode 20 is formed. The gate electrode 20 is formed by forming a conductive film on the substrate 31. To form the conductive film, a metal such as aluminum (Al), tungsten (W), molybdenum (Mo), tantalum (Ta), chromium (Cr), titanium (Ti), or copper (Cu), an alloy of any of these metals, or a nitride of any of these metals, can be appropriately used. Further, the conductive film may be formed by laminating a plurality of these layers.

Figure 5A:
FIG. 5A is a diagram for explaining a process of producing the photosensor substrate in Embodiment 1.

As one example, W and TaN are deposited with use of a sputtering device so as to have a film thickness of 300 nm and a film thickness of 18 nm, respectively, and thereafter, W and TaN are patterned into a desired pattern by using the photolithography method and the dry etching method, whereby the gate electrode 20 is formed (see FIG. 5A).

<Forming Gate Insulating Film>

Subsequently, the gate insulating film 32 is formed so as to cover the substrate 31 and the gate electrode 20 (see FIG. 5B). Here, the gate insulating film 32 is formed in a two-layer laminate structure. To form the gate insulating film 32, for example, silicon oxide ($SiO_x$), silicon nitride ($SiN_x$), silicon oxide nitride ($SiO_xN_y$) (x>y), silicon nitride oxide ($SiN_xO_y$) (x>y), or the like, can be appropriately used. In order to prevent an impurity or the like from being diffused from the substrate 31, desirably, the gate insulating film 32 on the lower layer side is formed with silicon nitride ($SiN_x$), silicon nitride oxide ($SiN_xO_y$) (x>y), or the like, and the gate insulating film 32 on the upper layer side is formed with silicon oxide ($SiO_x$), silicon oxide nitride ($SiO_xN_y$) (x>y), or the like. A noble gas element such as argon may be contained in a reaction gas so as to be mixed in the insulating film. This makes it possible to form a fine insulating film having a smaller gate leakage current, at a low film forming temperature.

As an example, SiN and $SiO_2$ are sequentially deposited so as to have thicknesses of 325 nm and 10 nm, respective, by a CVD device, whereby the gate insulating film 32 is formed.

<Forming Semiconductor Layer>

Figure 5B:
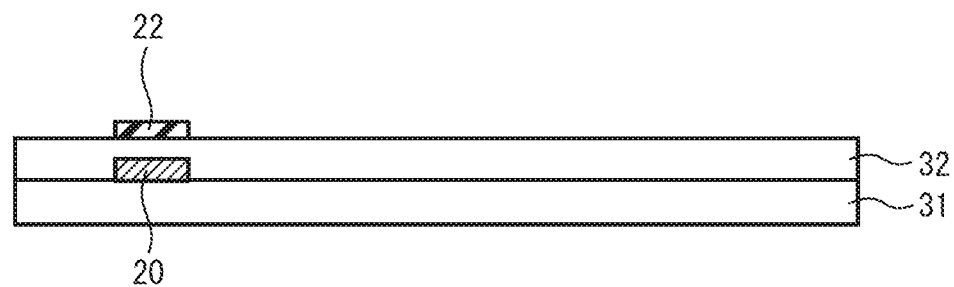
FIG. 5B is a producing process subsequent to that illustrated in FIG. 5A.

Next, on the gate insulating film 32, the semiconductor layer 22 is formed (see FIG. 5B). The semiconductor layer 22 contains, for example a semiconductor of an In—Ga—Zn—O type (hereinafter referred to as "In—Ga—Zn—O-based semiconductor"). Here, the In—Ga—Zn—O-based semiconductor is a ternary oxide of indium (In), gallium (Ga), and zinc (Zn), in which the ratio (composition ratio) of In, Ga, and Zn is not limited particularly and may be, for example, In:Ga:Zn=2:2:1, In:Ga:Zn=1:1:1, In:Ga:Zn=1:1:2 or the like. The semiconductor layer 22 may contain, for example, $InGaO_3(ZnO)_5$.

The TFT having an In—Ga—Zn—O-based semiconductor layer has high mobility (20 times the mobility of amorphous silicon (a-Si) TFT or more) and having lower leakage current (one hundredth of the leakage current in the case of a-Si TFT, or less than that), thereby being suitably used as a driving TFT and a pixel TFT. The TFT having an In—Ga—Zn—O-based semiconductor layer has high mobility, and therefore, with this configuration, a compact TFT can be realized. The use of a TFT having an In—Ga—Zn—O-based semiconductor layer makes it possible to, for example, drastically reduce the electric power consumption of the device, and/or improve the resolution of the device.

The In—Ga—Zn—O-based semiconductor may be amorphous, or alternatively, may contain a crystalline part. The crystalline In—Ga—Zn—O-based semiconductor is preferably a crystalline In—Ga—Zn—O-based semiconductor in which the c-axis is aligned approximately vertically to the layer surfaces. The crystal structure of such an In—Ga—Zn—O-based semiconductor is disclosed in, for example, JP-A-2012-134475. The entire contents of the disclosure of JP-A-2012-134475 are herein incorporated by reference.

The semiconductor layer 22 may contain another oxide semiconductor instead of the In—Ga—Zn—O-based semiconductor. The semiconductor layer 22 may contain, for example, a Zn—O-based semiconductor (ZnO), an In—Z—O-based semiconductor (IZO (registered trademark)), a Zn—Ti—O-based semiconductor (ZTO), a Cd—Ge—O-based semiconductor, a Cd—Pb—O-based semiconductor, a CdO (cadmium oxide), a Mg—Zn—O-based semiconductor, an In—Sn—Zn—O-based semiconductor (for example, $In_2O_3$—$SnO_2$—ZnO), or an In—Ga—Sn—O-based semiconductor.

Examples of the Zn—O-based semiconductor include, for example, ZnO to which no impurity element is added, and a semiconductor obtained by adding an impurity to ZnO. Examples of the Zn—O-based semiconductor include, for example, semiconductors to which one kind or a plurality of kinds of impurity elements, among elements of Group I, elements of Group XIII, elements of Group XIV, elements of Group XV, and elements of Group XVII are added. The Zn—O-based semiconductor contains, for example, magnesium zinc oxide ($Mg_xZn_{1-x}O$), or cadmium zinc oxide ($Cd_xZn_{1-x}O$). The Zn—O-based semiconductor may be amorphous, or polycrystalline, or alternatively, in a microcrystalline state in which the amorphous state and the polycrystalline state exist mixedly.

The semiconductor layer 22 may contain another semiconductor, instead of the oxide semiconductor. For example, the semiconductor layer 22 may contain amorphous silicon, polycrystalline silicon, or low-temperature polysilicon.

The semiconductor layer 22 has a thickness of, for example, 30 nm to 100 nm. Here, as one example, the semiconductor layer 22 is formed in the following manner: a film of a semiconductor is formed by sputtering, and is patterned into a predetermined shape (pattern) by a photolithography process that includes an etching step using a resist mask.

<Forming Source Electrode/Drain Electrode>

Figure 5C:
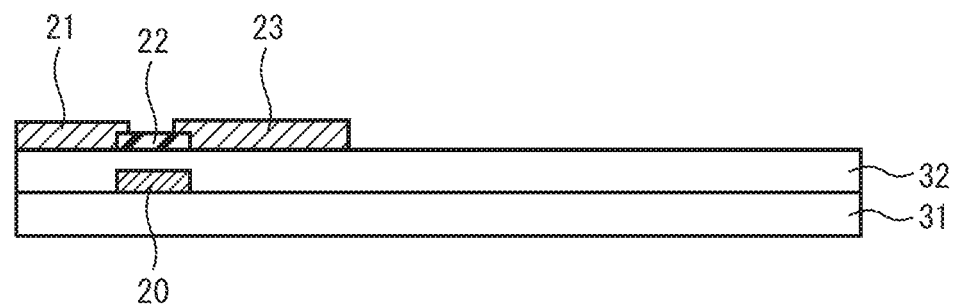
FIG. 5C is a producing process subsequent to that illustrated in FIG. 5B.

Subsequently, a conductive film is formed on a part of the gate insulating film 32 and the semiconductor layer 22, and is patterned into a predetermined shape (pattern) by a photolithography process that includes an etching step using a resist mask, whereby the source electrode 21 and the drain electrode 23 are formed (see FIG. 5C). For forming the conductive film, for example, a metal such as aluminum (Al), tungsten (W), molybdenum (Mo), tantalum (Ta), copper (Cu), chromium (Cr), or titanium (Ti), or an alloy of any of these metals, or a nitride of any of these metals, can be appropriately used. Further, the conductive film may be formed by laminating a plurality of these layers.

As one example, films of Ti, Al, and Ti are formed in the stated order by sputtering so as to have film thicknesses of 50 nm, 300 nm, and 33 nm, respectively, and thereafter, are patterned into desired patterns by the photolithography method and the dry etching method. Thereby, the TFT 2 is formed.

Incidentally, the contact hole CH1 is formed in the gate insulating film 32 by a photolithography process that includes an etching step using a resist mask. Further, on the gate insulating film 32, for example, the gate line G is form with the same conductive film as the conductive film functioning as the source electrode 21 and the drain electrode 23. The gate line G, however, may be formed using a conductive film different from the conductive film for forming the source electrode 21 and the drain electrode 23. The conductive film forming the gate line G is formed so as to be connected with the gate electrode 20 via the contact hole CH1 (see FIG. 3).

<Forming First Passivation Film>

Figure 5D:
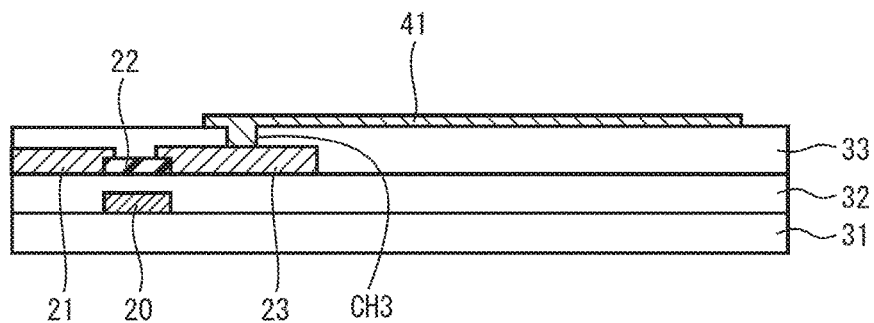
FIG. 5D is a producing process subsequent to that illustrated in FIG. 5C.
Figure 5E:
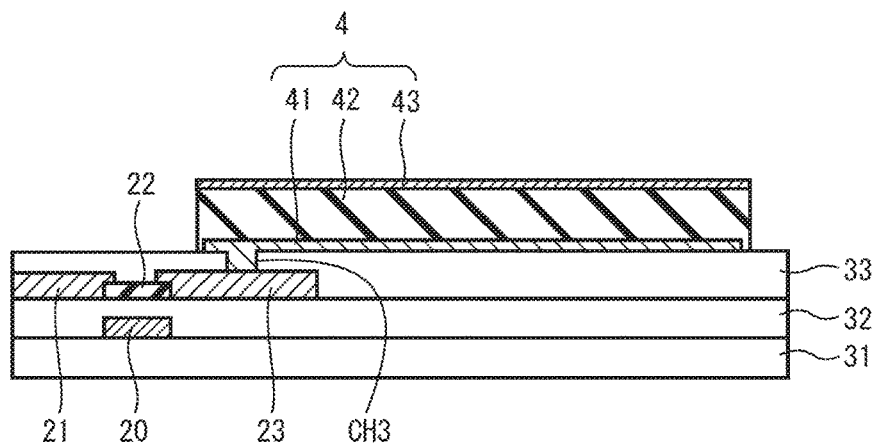
FIG. 5E is a producing process subsequent to that illustrated in FIG. 5D.

The first passivation film 33 is formed so as to cover the source electrode 21, the semiconductor layer 22, and the drain electrode 23 (see FIG. 5D). The first passivation film 33 has a thickness of, for example, 200 to 600 nm. The first passivation film 33 can be formed by a thin film forming method such as the plasma CVD method or the sputtering method, using an insulating material such as silicon nitride, silicon oxide, silicon nitride oxide, silicon oxide nitride, of the like. The first passivation film 33 is not limited to a single-layer film, but may have two or more layers. Further, a heat treatment may be applied to an entire surface of the substrate.

Thereafter, a contact hole CH3 is formed in the first passivation film 33 by a photolithography process including an etching step using a resist mask.

<Forming Lower Electrode>

Subsequently, a conductive film for forming the lower electrode 41 is formed on the first passivation film 33 (see FIG. 5D). The conductive film is formed so as to be connected with the drain electrode 23 via the contact hole CH3. To form the conductive film, a metal such as aluminum (Al), tungsten (W), molybdenum (Mo), tantalum (Ta), copper (Cu), chromium (Cr), or titanium (Ti), an alloy of any of these metals, or a nitride of any of these metals, can be appropriately used. Further, the conductive film may be formed by laminating a plurality of these layers.

As one example, films of Ti, Al, and Ti are formed in the stated order by sputtering so as to have film thicknesses of 50 nm, 150 nm, and 33 nm, respectively, and thereafter, are patterned into desired patterns by the photolithography method and the dry etching method.

<Forming Semiconductor Film and Upper Electrode of Photodiode>

An n-type semiconductor layer, an i-type semiconductor layer, and a p-type semiconductor layer are formed in this order over an entire surface of the substrate 31, by, for example the CVD method, so as to cover the first passivation films 33 and the lower electrodes 41. These semiconductor layers are for forming the semiconductor film 42. Thereafter, a film of a transparent conductive material such as IZO, ITO, or the like is formed by sputtering in an area that includes the area where the semiconductor film 42 is formed. The transparent conductive material is a conductor for the upper electrode 43. Thereafter, the semiconductor layers are patterned into a predetermined shape (pattern) by a photolithography process and dry etching, whereby the semiconductor film 42 and the upper electrode 43 are formed (see FIG. 5E).

Though this process, the photodiode 4, which is a laminate of the lower electrode 41, the semiconductor film 42, and the upper electrode 43, is formed.

Here, the n-type semiconductor layer of the semiconductor film 42 is formed with, for example, amorphous silicon (a-Si), and forms an $n^+$ area. This n-type semiconductor layer has a thickness of, for example, about 40 nm to 50 nm. The i-type semiconductor layer is a semiconductor layer having a conductivity lower than those of the n-type semiconductor layer and the p-type semiconductor layer, that is, for example, a non-doped intrinsic semiconductor layer; and it is formed with, for example, amorphous silicon (a-Si). This i-type semiconductor layer has a thickness of, for example, about 500 nm to 1500 nm. As the thickness is greater, the light sensitivity can be increased. The p-type semiconductor layer is formed with, for example, amorphous silicon (a-Si), and forms a $p^+$ area. This p-type semiconductor layer has a thickness of, for example, about 10 nm to 50 nm. The p-type semiconductor layer may be formed by injecting boron (B) ion in the upper layer part of the i-type semiconductor layer by the ion shower doping method or the ion injection method.

<Forming Second Passivation Film and Flattening Film>

Figure 5F:
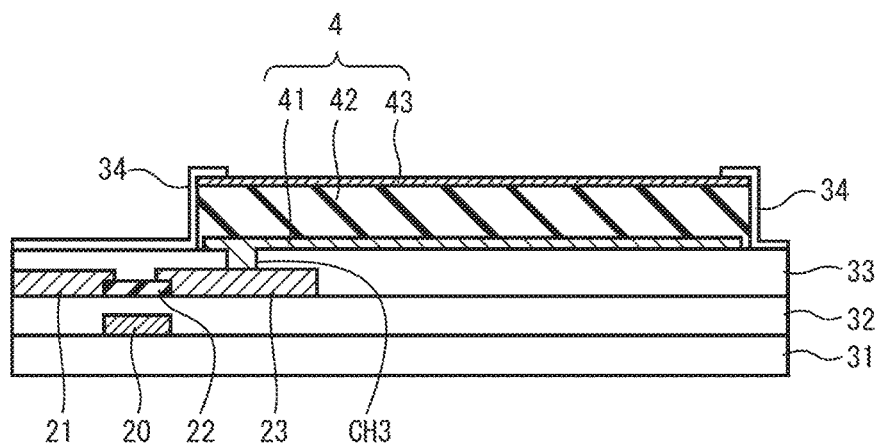
FIG. 5F is a producing process subsequent to that illustrated in FIG. 5E.
Figure 5G:
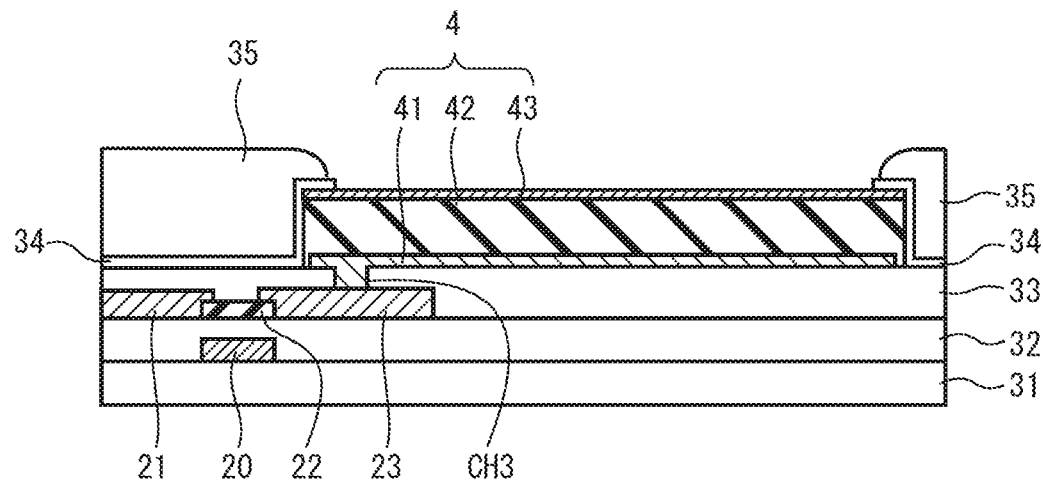
FIG. 5G is a producing process subsequent to that illustrated in FIG. 5F.
Figure 5H:
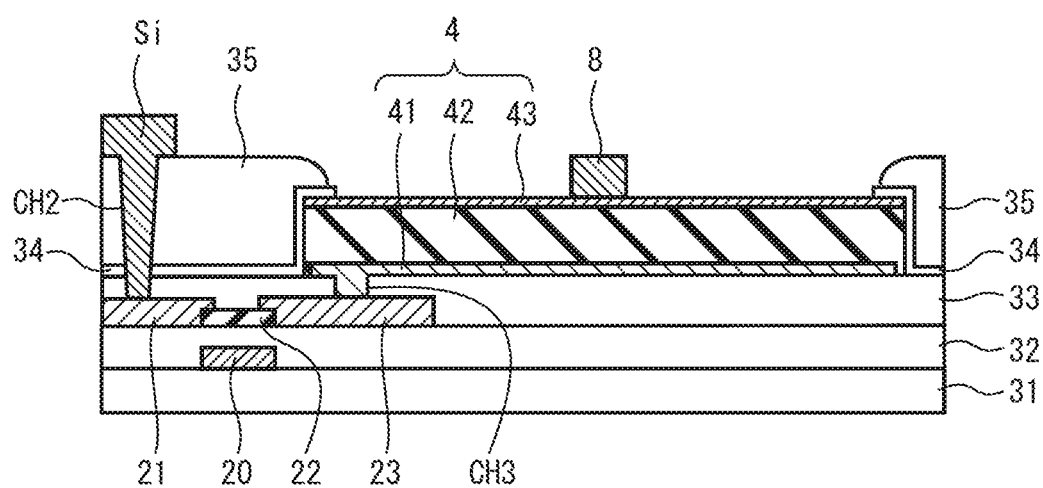
FIG. 5H is a producing process subsequent to that illustrated in FIG. 5G.

Subsequently, the second passivation film 34 is formed so as to cover a part above the TFT 2, and side surfaces and ends of a top surface of the photodiode 4 (see FIG. 5F). The material and the forming method of the second passivation film 34 may be the same as the material and the forming method of the first passivation film 33.

The second passivation film 34 has a thickness of, for example, 100 to 200 nm.

Thereafter, a flattening film is formed over an entire surface of the second passivation film 34. For example, a photosensitive resin is used as a material for forming the flattening film. By doing so, the flattening film 35 having an opening in correspondence to the area of the photodiode 4 can be formed in a desired pattern, without using photoresist (see FIG. 5G). The flattening film 35 has a thickness of, for example, 2 to 3 μm.

<Forming Source Lines and Bias Lines>

Above the source electrode 21, the contact hole CH2 is formed in the first passivation film 33, the second passivation film 34, and the flattening film 35 by a photolithography process including an etching step using a resist mask. Then, a conductive film is formed on the flattening film 35, whereby the source line S is formed, and a conductive film is formed on the upper electrode 43 of the photodiode 4, whereby the bias line 8 is formed (see FIG. 5H). The conductive film forming the source line S is formed so as to be connected with the source electrode 21 via the contact hole CH2. To form the conductive film, for example, a metal such as aluminum (Al), molybdenum (Mo), or titanium (Ti) can be used.

As one example, films of Ti, Al, and Ti are formed by sputtering so as to have film thicknesses of 50 nm, 600 nm, and 33 nm, respectively, and thereafter, the films can be patterned into a desired pattern by using the photolithography method and the dry etching method. In other words, the source line S and the bias line 8 are formed in parallel in the same layer. As the material for the conductive film for forming the source line Si, a material different from the material for the conductive film for forming the source electrode 21 can be used.

[Embodiment 2]

In Embodiment 1 described above, the TFT 2 is of a bottom gate type. In Embodiment 2, the TFT 2 is of a top gate type.

Figure 6:
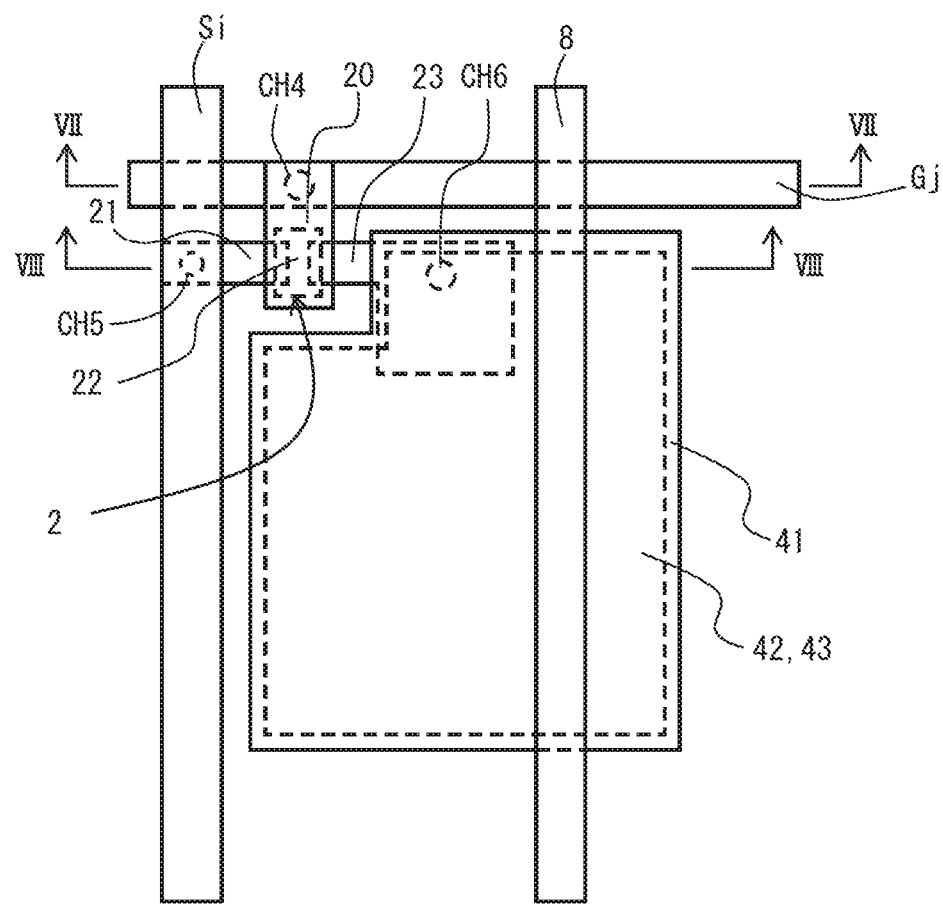
FIG. 6 illustrates an exemplary configuration of a sensor part in Embodiment 2 when viewed in a direction vertical to a photosensor substrate.
Figure 7:
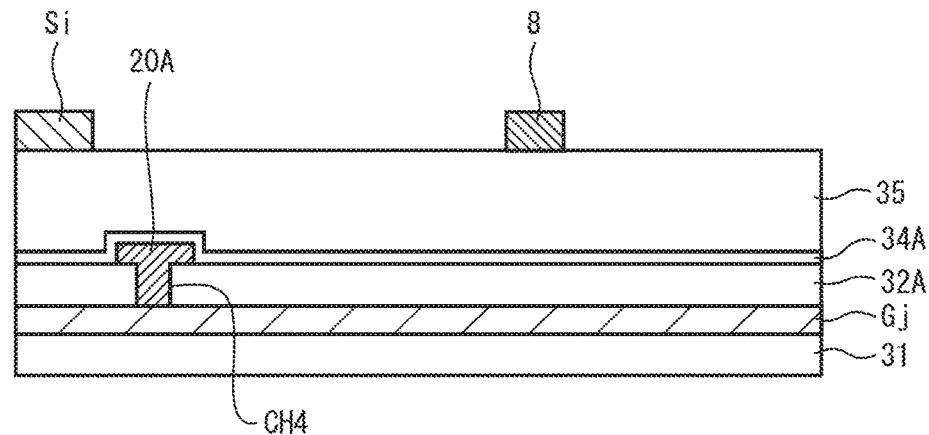
FIG. 7 is a cross-sectional view taken along line VII-VII in FIG. 6.
Figure 8:
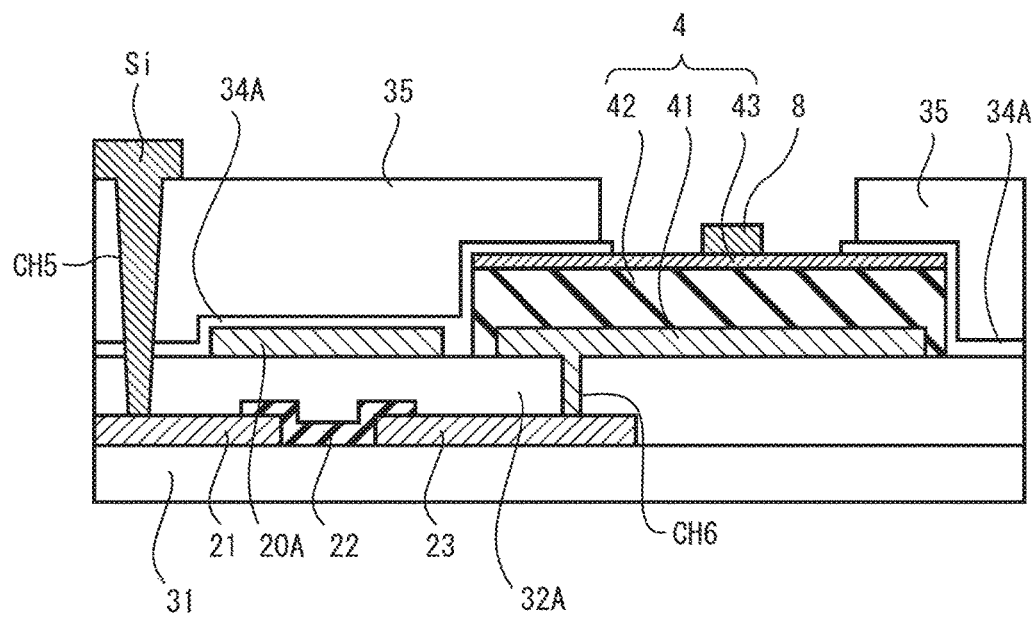
FIG. 8 is a cross-sectional view taken along line VIII-VIII in FIG. 6.

FIG. 6 illustrates an exemplary configuration of a sensor part 1 when viewed in a direction vertical to a photosensor substrate 10A in Embodiment 2. FIG. 7 is a cross-sectional view taken along line VII-VII in FIG. 6. FIG. 8 is a cross-sectional view taken along line VIII-VIII in FIG. 6. The following description principally describes constituent members that are different from those of the configuration in Embodiment 1.

As illustrated in FIG. 8, a source electrode 21, a semiconductor layer 22, and a drain electrode 23 are arranged on a substrate 31. A gate insulating film 32A, which is an insulating layer, is provided so as to cover the source electrode 21, the semiconductor layer 22, and the drain electrode 23.

The gate electrode 20A is arranged on the gate insulating film 32A. Further, a lower electrode 41, a semiconductor film 42, and an upper electrode 43 are laminated in the stated order on the gate insulating film 32A. In other words, the gate electrode 20A and the lower electrode 41 are provided in the same layer.

In the gate insulating film 32A, a contact hole CH6 for electrically connecting the lower electrode 41 and the drain electrode 23 is formed. In other words, the lower electrode 41 is electrically connected with the drain electrode 23 via the contact hole CH6.

A passivation film 34A, which is an insulating layer, is formed so as to cover side surfaces and top surfaces of the gate electrode 20A and the photodiode 4. On the passivation film 34A, a flattening film 35 is formed.

The gate line Gj is provided in the same layer as the layer where the source electrode 21 and the drain electrode 23 are provided, that is, on the substrate 31. As illustrated in FIG. 7, the gate line Gj is provided in a layer different from the layer where the gate electrode 20A is provided. In other words, the gate insulating film 32A is formed on the gate line Gj, and the gate electrode 20A is arranged on the gate insulating film 32A. In the gate insulating film 32A, a contact hole CH4 is formed.

The gate electrode 20A is connected with the gate line Gj via the contact hole CH4.

As illustrated in FIG. 8, the source line Si is provided in a layer different from the layer where the source electrode 21 is provided. More specifically, on the source electrode 21, the gate insulating film 32A, the passivation film 34A, and the flattening film 35 are formed in the stated order, and on the flattening film 35, the source line Si is formed. A contact hole CH5 is formed in the gate insulating film 32A, the passivation film 34A, and the flattening film 35. The source electrode 21 is connected with the source line Si via the contact hole CH5, as illustrated in FIG. 8.

In the present embodiment as well, the gate line Gj is provided in a layer different from the layer where the gate electrode 20A is provided, which allows the material and film thickness of the gate line Gj to be different from the material and film thickness of the gate electrode 20A. In the present embodiment also, the material for the gate line Gj can be a material having a resistance smaller than that of the material for the gate electrode 20A. As a material for the gate line Gj, for example, a material having a specific resistance equal to or smaller than ½ of that of the material for the gate electrode 20A can be selected. Further, the film thickness of the gate line Gj is greater than the film thickness of the gate electrode 20. The film thickness of the gate line Gj can be set to be equal to or greater twice the film thickness of the gate electrode 20A, for example. This makes it possible to decrease the resistance of the gate line Gj, as compared with a case where the material and film thickness of the gate line Gj are the same as those of the gate electrode 20A.

It should be noted that gate line Gj may be formed so as to satisfy at least a condition of having a greater film thickness or a condition of being formed with a material having a smaller specific resistance, as compared with the gate electrode 20.

Further, as described above, in the present embodiment as well, the source line Si is provided in a layer different from the layer where the source electrode 21 is provided, which allows the material and film thickness of the source line Si to be different from the material and film thickness of the source electrode 21. In the present embodiment also, the film thickness of the source line Si is greater than the film thickness of the source electrode 21. The film thickness of the source line Si can be set to be equal to or greater than twice the film thickness of the source electrode 21, for example. Further, as a material for the source line Si, for example, a material having a specific resistance smaller than that of the material for the source electrode 21, for example, a material having a specific resistance equal to or smaller than ½ of that of the material for the source electrode 21, can be used. This makes it possible to decrease the resistance of the source line Si, as compared with a case where the material and film thickness of the source line Si are the same as those of the source electrode 21.

It should be noted that source line Si may be formed so as to satisfy at least either a condition of having a greater film thickness or a condition of being formed with a material having a smaller specific resistance, as compared with the source electrode 21.

(Producing Process)

FIGS. 9A to 9G illustrate exemplary producing steps for producing the photosensor substrate in the present embodiment. FIGS. 9A to 9G illustrate cross sections of a portion where the sensor part 1 is formed. In the following description, descriptions about constituent elements whose materials and film thicknesses are the same as those in Embodiment 1 are omitted, constituent elements whose materials and film thicknesses are different are described in detail.

Figure 9A:
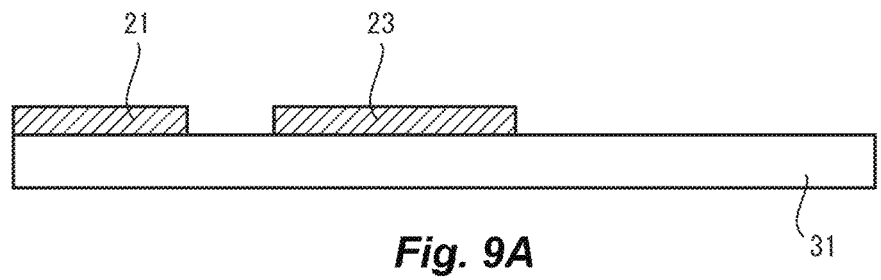
FIG. 9A is a diagram for explaining a process for producing the photosensor substrate in Embodiment 2.

First, the source electrode 21 and the drain electrode 23 are formed on the substrate 31 (see FIG. 9A). The source electrode 21 and the drain electrode 23 are formed by forming a conductive film on the substrate 31. Further, the gate line G is formed on the substrate 31, with, for example, the same conductive film at that functions as the source electrode 21 and the drain electrode 23. The gate line G, however, may be formed with use of a conductive film different from the conductive film for forming the source electrode 21 and the drain electrode 23.

Figure 9B:
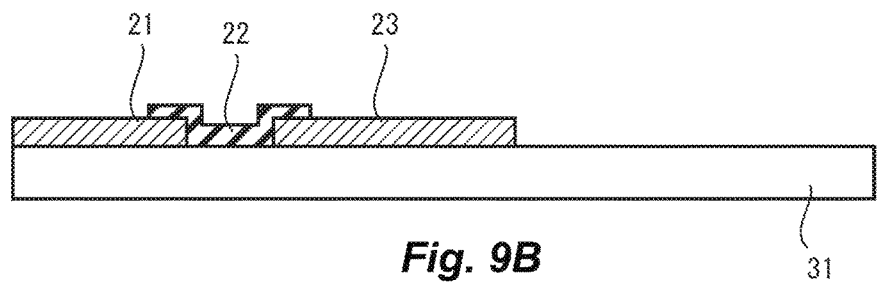
FIG. 9B is a producing process subsequent to that illustrated in FIG. 9A.

Subsequently, on the substrate 31, the semiconductor layer 22 is formed so as to cover a part of the source electrode 21 and the drain electrode 23 (see FIG. 9B).

Figure 9C:
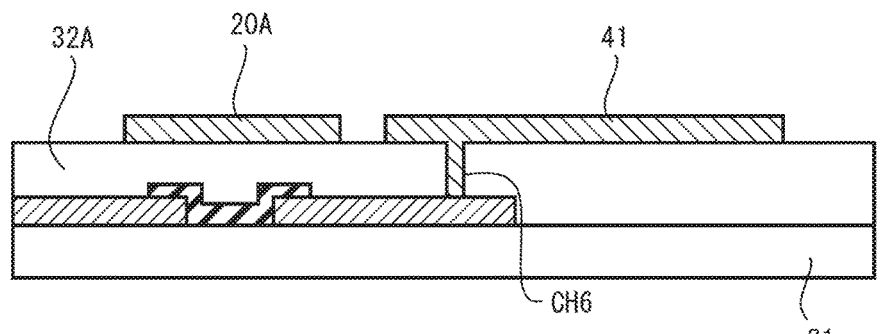
FIG. 9C is a producing process subsequent to that illustrated in FIG. 9B.
Figure 9D:
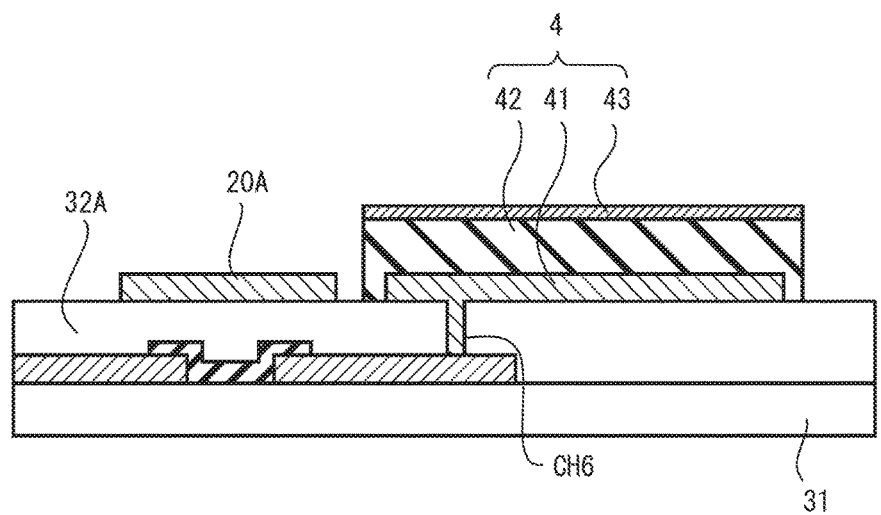
FIG. 9D is a producing process subsequent to that illustrated in FIG. 9C.

Next, the gate insulating film 32A is formed so as to cover the source electrode 21, the semiconductor layer 22, and the drain electrode 23 (see FIG. 9C).

Thereafter, the contact hole CH4 and the contact hole CH6 are formed in the gate insulating film 32 by a photolithography process that includes an etching step using a resist mask.

Subsequently, a conductive film for forming the gate electrode 20A and the lower electrode 41 is formed on the gate insulating film 32A. For forming the conductive film, for example, a metal such as aluminum (Al), tungsten (W), molybdenum (Mo), tantalum (Ta), copper (Cu), chromium (Cr), or titanium (Ti), or an alloy of any of these metals, or a nitride of any of these metals, can be appropriately used. Further, the conductive film may be formed by laminating a plurality of these layers. The conductive film is formed so as to be connected with the gate line G via the contact hole CH4, and to be connected with the drain electrode 23 via the contact hole CH6.

As one example, films of Ti, Al, and Ti are formed in the stated order by sputtering so as to have film thicknesses of 50 nm, 150 nm, and 33 nm, respectively, and thereafter, are patterned into desired patterns by the photolithography method and the dry etching method. Thereby, the gate electrode 20A and the lower electrode 41 are formed (see FIG. 9C). As illustrated in FIG. 7, the gate electrode 20A is connected with the gate line G via the contact hole CH4. Further, the lower electrode 41 is connected with the drain electrode 23 via the contact hole CH6.

Subsequently, an n-type semiconductor layer, an i-type semiconductor layer, and a p-type semiconductor layer are formed in this order over an entire surface of the substrate 31 by, for example, the CVD method, so as to cover the gate insulating films 32A, the gate electrodes 20A, and the lower electrodes 41. These semiconductor layers are for forming the semiconductor film 42. Thereafter, a film of a transparent conductive material such as IZO, ITO, or the like is formed by sputtering in an area that includes the area where the semiconductor film 42 is formed. The transparent conductive material is a conductor for the upper electrode 43. Thereafter, the semiconductor layers are patterned into a predetermined shape (pattern) by a photolithography process and dry etching, whereby the semiconductor film 42 and the upper electrode 43 are formed (see FIG. 9D). Though this process, the photodiode 4, which is a laminate of the lower electrode 41, the semiconductor film 42, and the upper electrode 43, is formed.

Figure 9E:
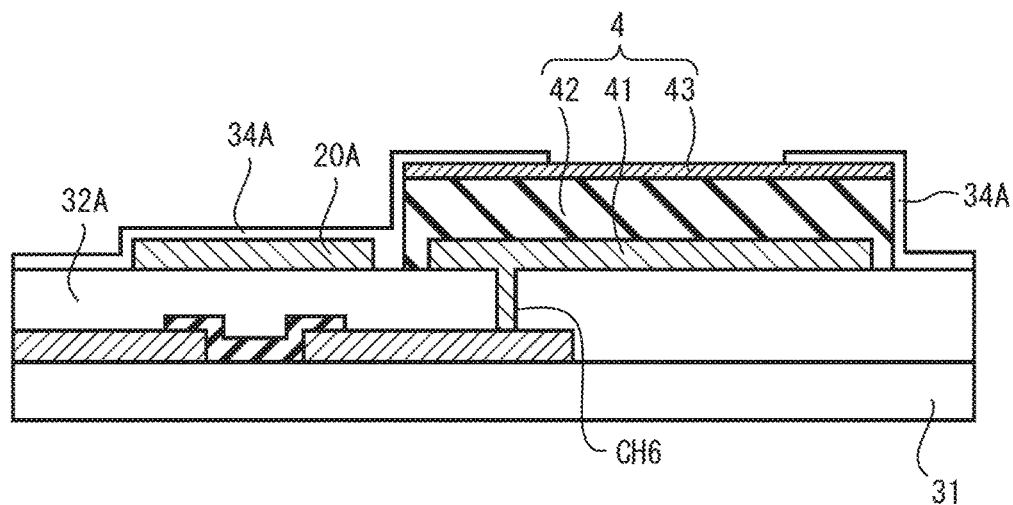
FIG. 9E is a producing process subsequent to that illustrated in FIG. 9D.
Figure 9F:
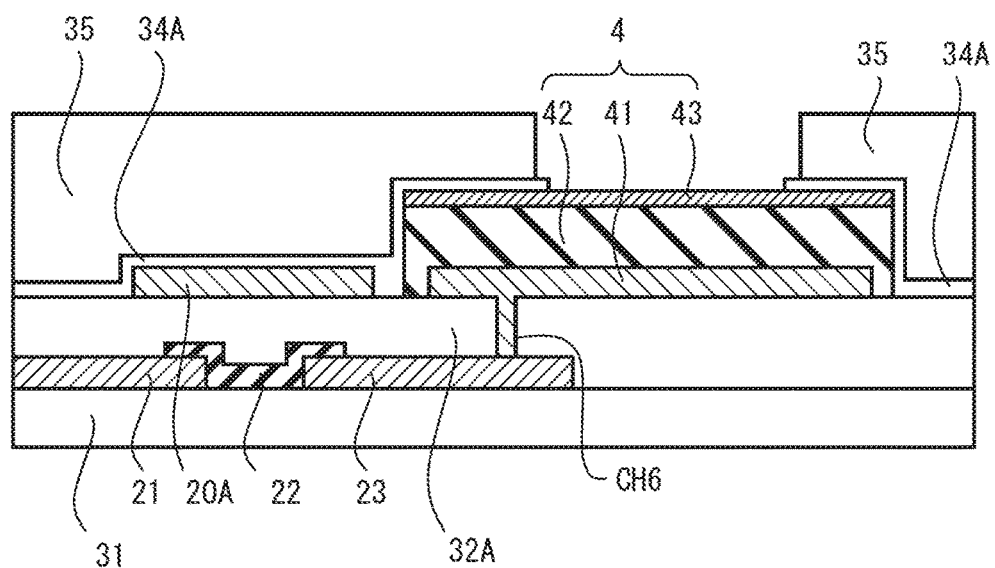
FIG. 9F is a producing process subsequent to that illustrated in FIG. 9E.
Figure 9G:
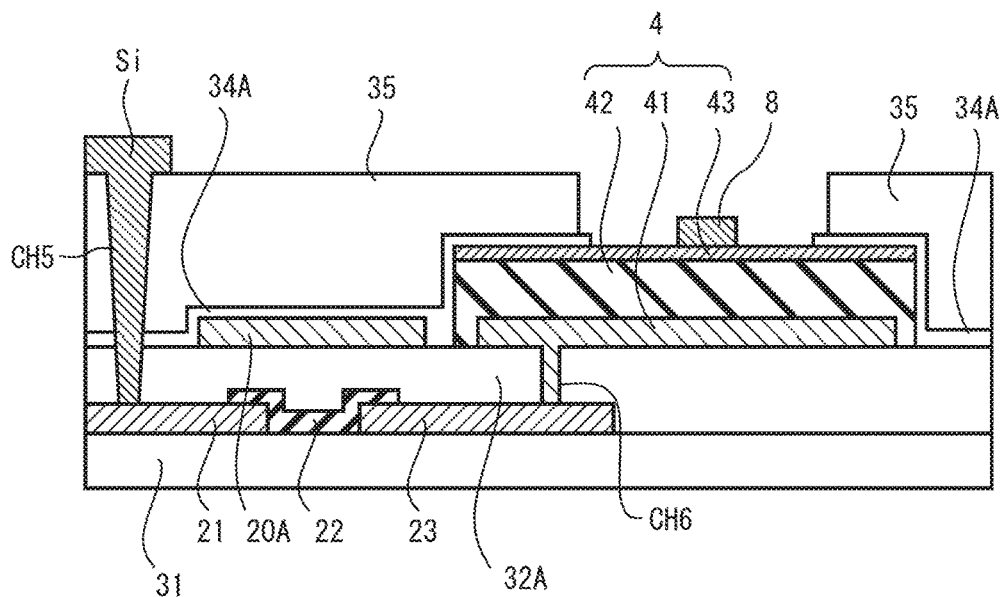
FIG. 9G is a producing process subsequent to that illustrated in FIG. 9F.

Subsequently, the passivation film 34A is formed so as to cover the gate insulating film 32A, the gate electrode 20A, and the photodiode 4 (see FIG. 9E).

Thereafter, a flattening film is formed over an entire surface of the passivation film 34A. For example, a photosensitive resin is used as a material for forming the flattening film. By doing so, the patterning in a desired pattern is performed without using photoresist, whereby the flattening film 35 having an opening in correspondence to the area of the photodiode 4 is formed (see FIG. 9F).

Thereafter, above the source electrode 21, a contact hole CH5 is formed in the flattening film 35 and the passivation film 34A by a photolithography process including an etching step using a resist mask. Then, a conductive film is formed on the flattening film 35, whereby the source line S is formed, and a conductive film is formed on the upper electrode 43 of the photodiode 4, whereby the bias line 8 is formed (see FIG. 9G). The conductive film forming the source line S is formed so as to be connected with the source electrode 21 via the contact hole CH5.

(Example of Application to X-Ray Image Detection Device)

Figure 10:
FIG. 10 illustrates an exemplary configuration in a case where the photosensor substrate illustrated in FIG. 1 is applied to an X-ray image detection device.

FIG. 10 illustrates an exemplary configuration in a case where the photosensor substrate 10 illustrated in FIG. 1 is applied to an X-ray image detection device. FIG. 10 illustrates a laminar configuration taken along a plane vertical to the substrate of the photosensor substrate 10. At a position that overlaps the sensor area of the photosensor substrate 10, a scintillator layer 13 is provided. The scintillator layer 13 can be formed with, for example, a phosphor that can convert X-ray into visible light. Examples of the phosphor include cesium iodide (CsI). The scintillator layer 13 can be formed by causing a film to adhere over the surface of the photosensor substrate 10, or by directly forming a film by vapor deposition or the like. On the scintillator layer 13, a protection layer 14 covering the scintillator layer 13 can be provided. This configuration allows a flat panel detector (FDP) for detecting an X-ray image to be realized.

To a terminal part T of the photosensor substrate 10, an electronic component 11 is connected, via a line 12. The electronic component 11 is, for example, a semiconductor chip, and can include a circuit that processes signals to be fed to the sensor part 1 or signals fed from the sensor part 1. The form of the circuit connected to the terminal part T, however, is not limited to this form of being mounted on the semiconductor chip. The circuit may be mounted on the photosensor substrate 10 by, for example, COG (Chip on glass), or alternatively, the circuit may be formed in flexible printed circuits (FPC) connected to the terminal part T.

The embodiment of the present invention also encompasses an X-ray image detection device that includes a photosensor substrate and a wavelength conversion layer arranged so as to be stacked on the photosensor substrate in this way.

Embodiments described above are merely examples for implementing the present invention. The present invention is not limited by the embodiments described above, and the present invention can be implemented with various modifications made without departing from the spirit and scope of the claims.

The above-described embodiments are described with reference to a photosensor substrate in which the photodiodes 4 are arranged on the active matrix substrate, but the substrate may be an active matrix substrate that does not include the photodiodes 4. Such an active matrix substrate can be used in, for example, a display device such as a liquid crystal display or an organic EL display.

The photodiode 4 may be connected with a plurality of (two, three, or more) TFTs. For example, a TFT in which an oxide semiconductor is used as a material for the semiconductor layer has high mobility, and therefore can be used as a TFT in an amplifier circuit (for example, a source follower circuit (drain ground circuit)). An amplifier circuit can be formed by providing a plurality of TFTs in one pixel.

Further, each sensor part 1 may further include an accumulation capacitor (CS) (not shown). For example, the photodiode 4 may be connected with the TFT and the accumulation capacitor. Such a configuration that at least one TFT, one photodiode, and one accumulation capacitor are arranged at each pixel can be obtained.

In the above-described embodiments, the photodiode 4 is formed in the semiconductor layer in the PIN structure, but the photodiode 4 may be, for example, of a PN type or a schottky type. Further, the semiconductor used in the photodiode 4 is not limited to amorphous silicon. Still further, the photoelectric conversion element may be a MIS-type sensor.

Figure 11:
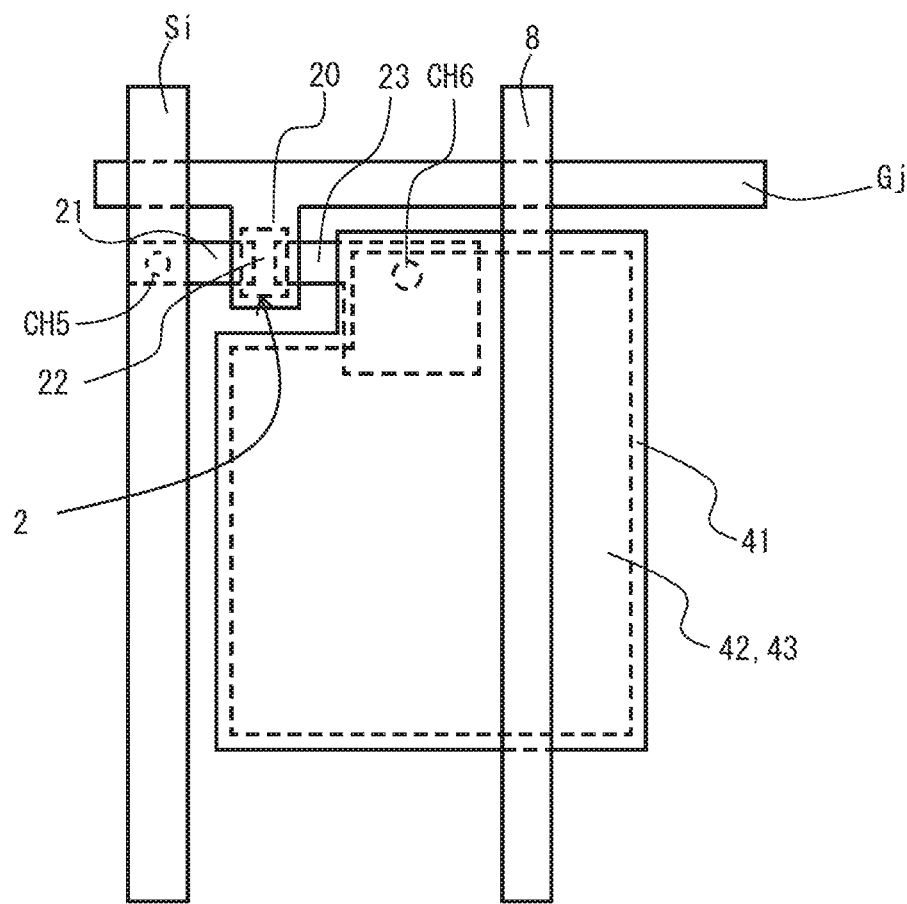
FIG. 11 is an exemplary configuration of a sensor part in a modification example of embodiment 2, when viewed in a direction vertical to the photosensor substrate.

In Embodiment 2, the gate line Gj is provided in a layer different from the layer where the gate electrode 20A is provided, but these may be provided in the same layer. FIG. 11 illustrates an exemplary configuration of the sensor part 1 when viewed in a direction vertical to the photosensor substrate 10A, in a modification example of Embodiment 2. As illustrated in FIG. 11, the gate line Gj is provided integrally in the same layer as the layer where the gate electrode 20A is provided. With this configuration, it is possible to form the gate line G and the source line S after the semiconductor layer 22 of the TFT 2 is formed. This allows configurations of the gate lines G and the source lines S, such as the materials and the film thicknesses thereof, to be less restricted by the process for producing the semiconductor layer of the transistor. This allows the degree of freedom in designing the gate lines G and the source lines S to improve further.

DESCRIPTION OF REFERENCE NUMERALS

1: sensor part
10: photosensor substrate
2: TFT (one example of transistor)
20, 20A: gate electrode
21: source electrode
22: semiconductor layer
23: drain electrode
31: substrate
34: second passivation film
34A: passivation film
35: flattening film
41: lower electrode
42: semiconductor film
43: upper electrode
4: photodiode (one example of photoelectric conversion element)
S: source line
G: gate line

The invention claimed is:
1. An active matrix substrate comprising:
a substrate;
a plurality of first lines that are arranged on the substrate and extend in a first direction;
a plurality of second lines that are arranged on the substrate and extend in a second direction that is different from the first direction;
transistors that are arranged in correspondence to points of intersection between the first lines and the second lines, respectively, and are connected with the first lines and the second lines; and
an insulating layer,
wherein at least either the first lines or the second lines are connected with electrodes of the transistors via contact holes in the insulating layer, and are formed so as to satisfy at least either a condition of having a greater film thickness or a condition of being formed with a material having a smaller specific resistance, as compared with the electrodes of the transistors to which the lines are connected via the contact holes in the insulating layer,
each transistor includes a gate electrode, a gate insulating film, a semiconductor layer provided at a position opposed to the gate electrode with the gate insulating film being interposed therebetween, and a drain electrode and a source electrode that are connected with the semiconductor layer and that are provided so as to be opposed to each other in a direction parallel with the substrate,
the first lines are formed in a same layer as that of the drain electrode and the source electrode, and are connected with the gate electrodes via contact holes in the gate insulating film, and
the second lines are connected to the drain electrodes or the source electrodes of the transistors via the contact holes in the insulating layer arranged so as to overlap with the gate insulating film.

2. The active matrix substrate according to claim 1,
wherein the insulating layer includes a passivation film that covers the transistors,
the active matrix substrate further comprising photoelectric conversion elements arranged in correspondence to the points of intersection between the first lines and the second lines, respectively, the photoelectric conversion elements being connected with the transistors via contact holes in the passivation film.

3. The active matrix substrate according to claim 1,
wherein the insulating layer includes a passivation film that covers the transistors,
the active matrix substrate further comprising photoelectric conversion elements arranged in correspondence to the points of intersection between the first lines and the second lines, respectively, the photoelectric conversion elements being connected with the transistors via the contact holes in the gate insulating film.

4. The active matrix substrate according to claim 2,
wherein the insulating layer further includes a flattening film provided on portions of the passivation film where the photoelectric conversion elements are not provided, and
at portions where the first lines and the second lines intersect, the passivation film and the flattening film are arranged between the first lines and the second lines, when viewed in a direction vertical to the substrate.

5. The active matrix substrate according to claim 1,
wherein the gate electrode of the transistor is provided between the gate insulating film and the substrate.

\* \* \* \* \*